(12) United States Patent
Chen et al.

(10) Patent No.: US 6,253,452 B1
(45) Date of Patent: Jul. 3, 2001

(54) METHOD FOR MANUFACTURING CYLINDRICAL RADIATOR

(76) Inventors: Hsin-Yi Chen, No. 10, Wen-Chee-Wu Street, Gueishan, Hsiang, Taoyuan Hsien; Hui-Chia Huang, No. 8, Lane 202, Long-An Road, Hsichi City, Taipei Hsien, both of (TW)

(*) Notice: Subject to any disclaimer, the term of this patent is extended or adjusted under 35 U.S.C. 154(b) by 0 days.

(21) Appl. No.: 09/447,306

(22) Filed: Nov. 23, 1999

(51) Int. Cl.$^7$ ................................................. B21D 53/06
(52) U.S. Cl. ................. 29/890.5; 29/890.48; 29/890.046
(58) Field of Search ........................... 29/890.3, 890.046, 29/890.048, 890.5; 72/283, 371; 83/54

(56) References Cited

U.S. PATENT DOCUMENTS

| | | | |
|---|---|---|---|
| 3,630,062 | * 12/1971 | Odaki et al. | 72/283 |
| 4,171,634 | * 10/1979 | Perkins | 72/371 |
| 4,437,329 | * 3/1984 | Geppelt et al. | 72/371 |
| 4,698,196 | * 10/1987 | Fabian | 83/54 |
| 4,779,496 | * 10/1988 | Evans et al. | 83/54 |
| 4,827,816 | * 5/1989 | Takaniemi | 83/54 |
| 4,942,751 | * 7/1990 | Fuchs, Jr. | 72/283 |
| 5,036,693 | * 8/1991 | Duffy | 72/283 |
| 5,092,038 | * 3/1992 | Geppelt et al. | 29/890.048 |

* cited by examiner

*Primary Examiner*—I Cuda Rosenbaum
*Assistant Examiner*—Trinh Nguyen
(74) *Attorney, Agent, or Firm*—Rosenberg, Klein & Lee

(57) ABSTRACT

A method for manufacturing a cylindrical radiator that includes the step of drawing material to form an elongated blank material having a hollow cylindrical base section and multiple heat-radiating fins radially projecting from the outer circumference of the base section. Next, the elongated blank material is cut to form a plurality of blanks. Then, a top portion of each blank is bored to separate the top portions of the heat-radiating fins from each other. A fan seat is installed into a central through hole of the base section to complete the manufacturing of the cylindrical radiator.

2 Claims, 6 Drawing Sheets

METHOD FOR MANUFACTURING CYLINDRICAL RADIATOR

BACKGROUND OF THE INVENTION

The present invention relates to a method for manufacturing a cylindrical radiator, and more particularly to a method for manufacturing a cylindrical radiator, in which it is unnecessary to form the radiator by processing solid bar material.

A conventional radiator applied to central processing unit (CPU) of a computer includes multiple heat-radiating fins parallelly arranged around the outer periphery of the radiator in a rectangular form. A heat-radiating fan is fixedly mounted on top end of the radiator for enhancing the heat-radiating efficiency of the radiator. Such radiator with the parallelly arranged fins has a relatively large volume. Moreover, the parallelly arranged fins will intervene with the escaping airflow of the heat-radiating fan so that the heat-radiating efficiency will be reduced.

Therefore, an improved cylindrical radiator has been developed to overcome the above shortcoming. As shown in FIG. 8, such radiator 100 is made of a solid bar material by processing. The manufacturing method includes steps of:

(a) providing a solid bar material with a certain length;

(b) axially milling one end of the bar material to form a fan seat 101; and (c) using a milling tool to one by one radially mill the outer circumference of the bar material to form multiple heat-radiating fins 102 arranged about the circular center of the bar material.

In the above manufacturing procedure, some shortcomings exist as follows:

1. In the manufacturing procedure, the solid bar material is milled to produce a great amount of waste material. This causes waste of resource and increment of cost for the material.
2. The heat-radiating fins must be milled one by one. Because each radiator includes numerous heat-radiating fins, it is time-consuming and difficult to manufacture the radiator.
3. The cost for the material and the processing is very high and it is time-consuming to manufacture the radiator so that the unit price of such radiator is very high and thus the competitive ability of the product is lowered.

SUMMARY OF THE INVENTION

It is therefore a primary object of the present invention to provide a method for manufacturing a cylindrical radiator, in which it is unnecessary to manufacture the cylindrical radiator with solid material so that the waste of resource is reduced and the cost for the material is lowered.

It is a further object of the present invention to provide the above manufacturing method in which the respective heat-radiating fins are formed at one time by way of drawing rather than milled one by one. Therefore, the heat-radiating fins can be formed very quickly.

It is still a further object of the present invention to provide the above manufacturing method in which the manufacturing procedure is speeded so that the manufacturing cost is effectively lowered to greatly enhance competitive ability of the product.

According to the above objects, the method for manufacturing cylindrical radiator of the present invention includes the steps of:

1. by way of drawing, manufacturing a blank material with a hollow cylindrical base section and multiple heat-radiating fins radially projecting from the outer circumference of the base section;

2. cutting the above elongated blank material into a certain length to form a blank material; and 3. from one end face of the blank material, axially turning a top portion of the hollow cylindrical base section so as to separate the top portions of the heat-radiating fins from each other to form a free end, only the bottom root portions of the heat-radiating fins integrally connecting with the bottom end of the base section.

A fan seat is fitted into a central through hole of the base section to complete the manufacturing of the cylindrical radiator.

The above manufacturing method can further includes a step of prior to fitting the fan seat into the through hole of the base section, clamping two ends of each heat-radiating fin with two cramps and twisting the two cramps relative to each other so as to bend and incline the heat-radiating fin to form a turbo cylindrical radiator.

The present invention can be best understood through the following description and accompanying drawings wherein:

DETAILED DESCRIPTION OF THE PREFERRED EMBODIMENTS

Please refer to FIGS. 1 to 7. The method for manufacturing a cylindrical radiator of the present invention utilizes a non-solid bar material to manufacture the radiator by integral processing. This lowers the cost for the material and simplifies the manufacturing procedure.

Figure 1:
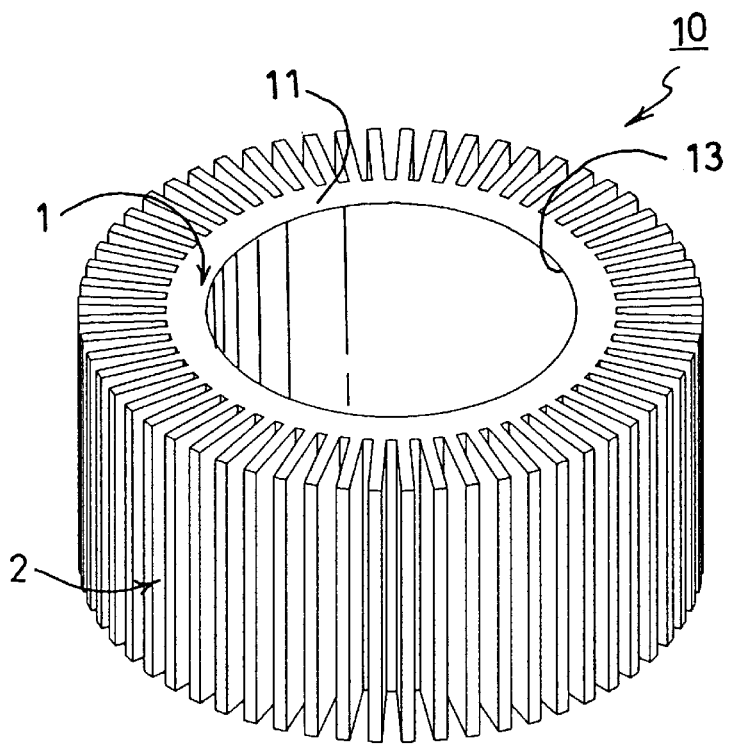
FIG. 1 is a perspective view of the blank material of the cylindrical radiator of the present invention.
Figure 2:
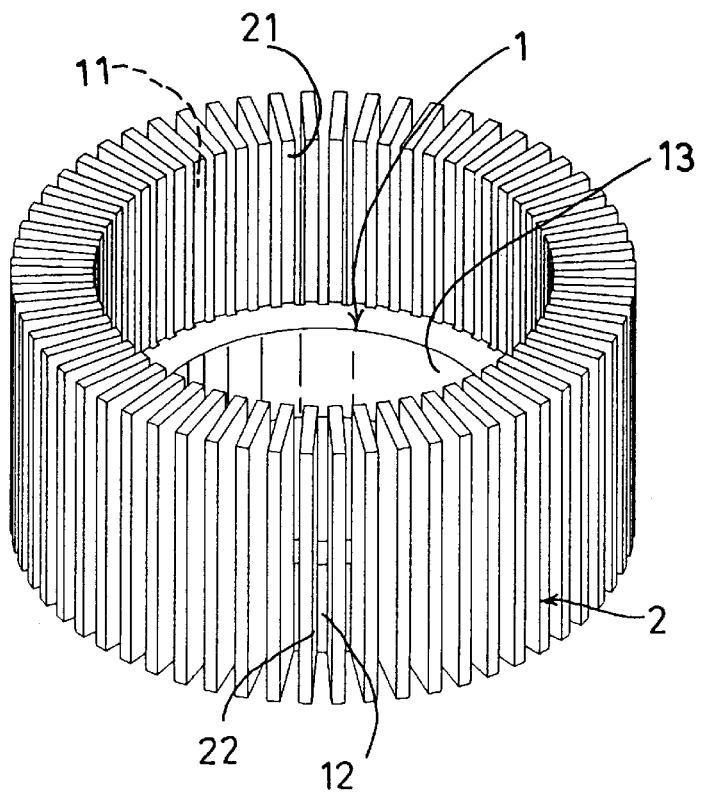
FIG. 2 is a perspective view according to FIG. 1, showing that from one end of the blank material, a top portion of the hollow cylindrical base section is turned.
Figure 3:
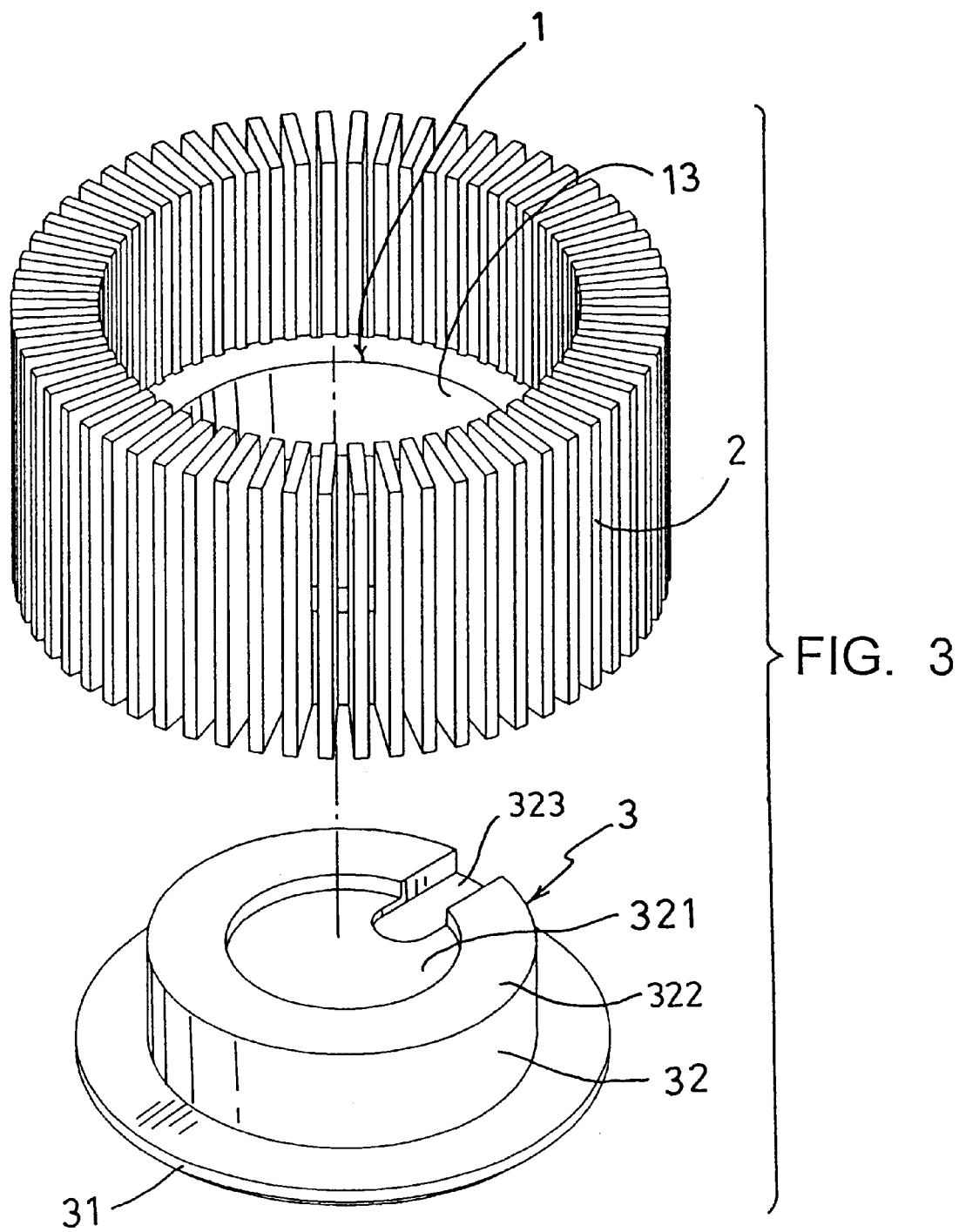
FIG. 3 is a perspective exploded view showing that a fan seat is fitted into the central through hole of the base section of the blank material.
Figure 4:
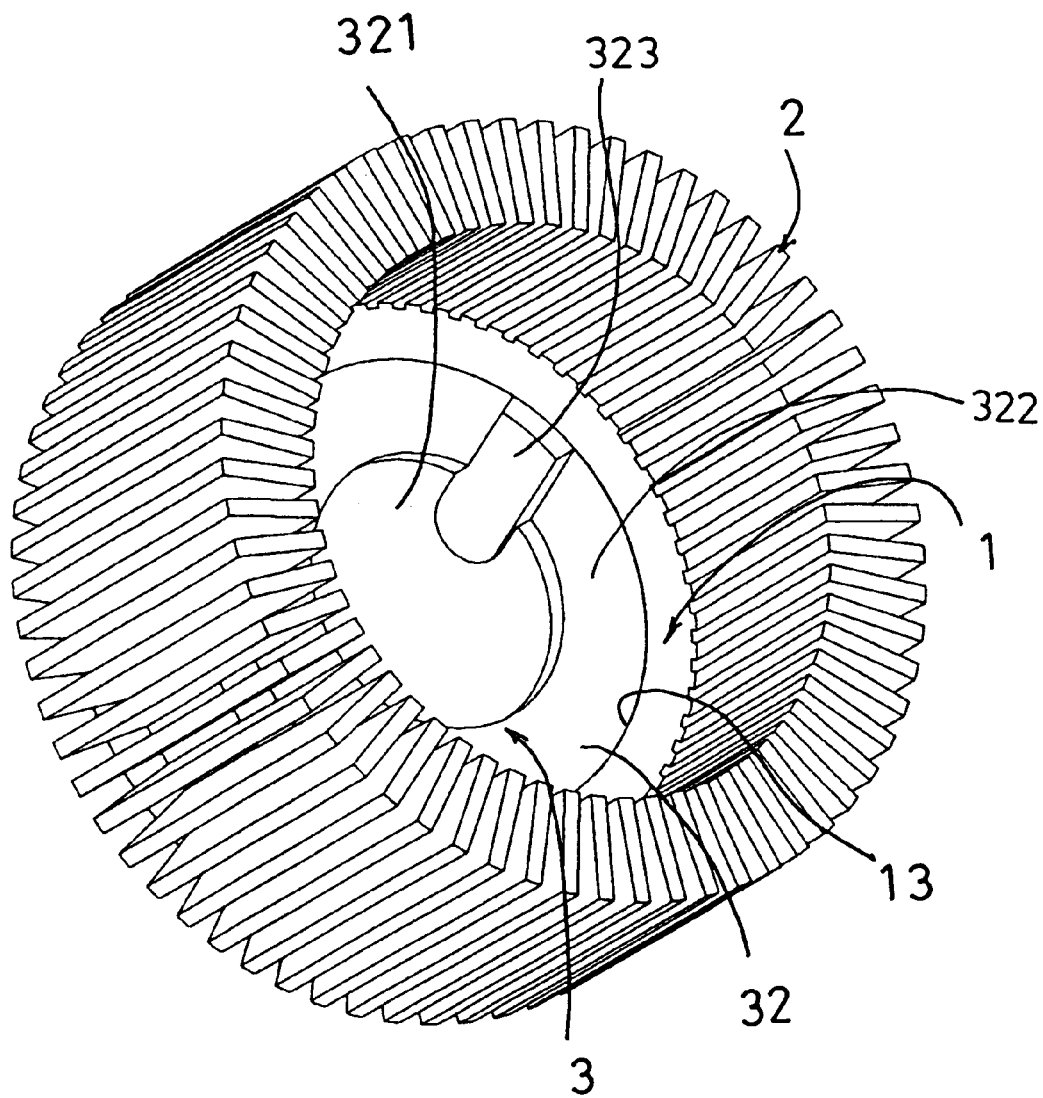
FIG. 4 is a perspective assembled view of the cylindrical radiator of the present invention.

FIGS. 1 to 4 show a first embodiment of the present invention, which includes the steps of:

(a) by way of drawing, manufacturing a blank material with a hollow cylindrical base section 1 and multiple heat-radiating fins 2 radially projecting from the outer circumference of the base section 1;

(b) cutting the above elongated blank material into a certain length to form a blank material 10 (as shown in FIG. 1);

(c) from one end face of the blank material 10, axially turning (as by boring with a lathe) a top portion 11 of the hollow cylindrical base section so as to separate the top portions 21 of the heat-radiating fins from each other to form a free end, only the bottom root portions 22 of the heat-radiating fins integrally connecting with the bottom end 12 of the base section (as shown in FIG. 2); and (d) fitting a fan seat 3 into the central through hole 13 of the base section to complete the manufacturing of the cylindrical radiator (as shown in FIGS. 3 and 4).

The above fan seat 3 includes a disc section 31 for resting on the circumference of the bottom end of the base section 1. In addition, the disc section 31 tightly fixedly attaches to one side of the CPU to be radiated. A boss section 32 axially projects from the center of the disc section 31 for snugly fitting into the central through hole 13 of the base section 1. A heat-radiating fan (not shown) is located in a dent 321 formed on the top end of the boss section 32, whereby the heat-radiating fan can rotate at the center of the heat-radiating fins 2 to radiate the heat. The top end of the boss section 32 is formed with a dent 321 and an annular flange 322. A part of the flange 322 is formed with a notch 323 through which a power cable (not shown) of the heat-radiating fan is passed and conducted out of the fan seat 3 to connect with the power supply.

The above manufacturing method can further includes a step of forming inner thread on the wall of the central through hole 13 of the base section for locking the boss section 32 of the fan seat 3 in the central through hole 13.

Figure 5:
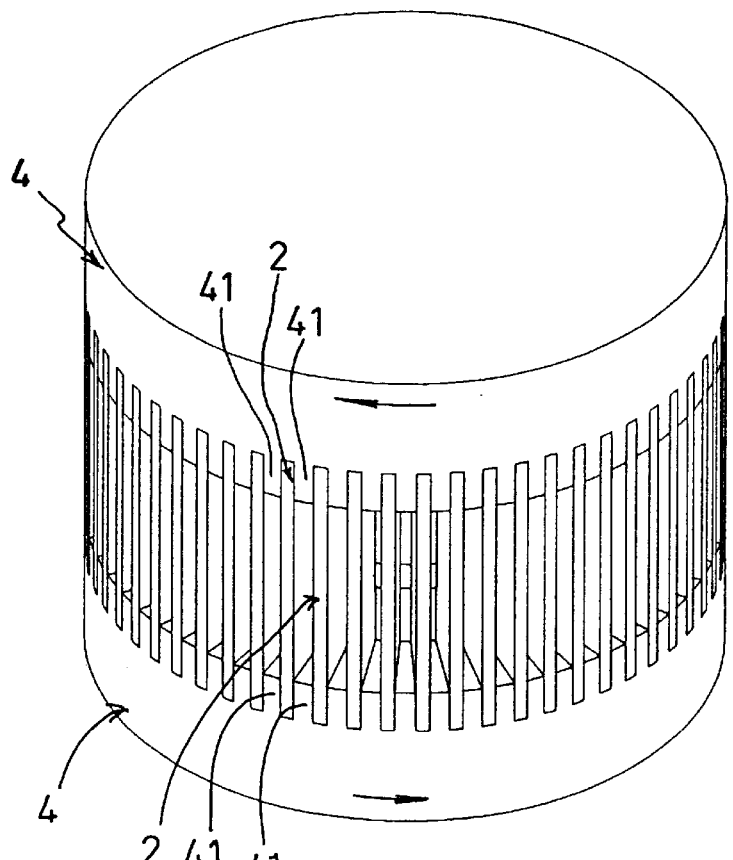
FIG. 5 is a perspective view showing a state of the cylindrical radiator of the present invention prior to twisting the heat-radiating fins.
Figure 6:
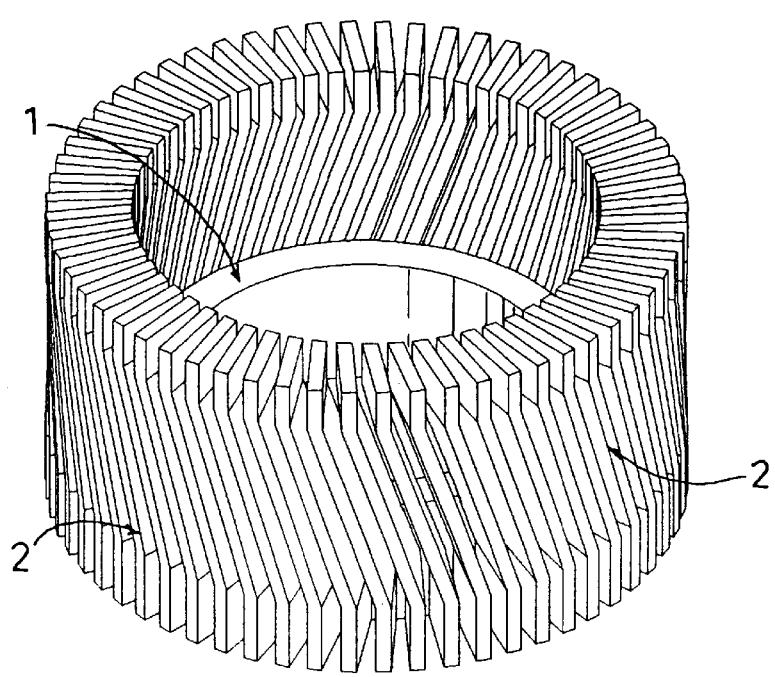
FIG. 6 is a perspective view showing a state of the cylindrical radiator of the present invention after twisting the heat-radiating fins.
Figure 7:
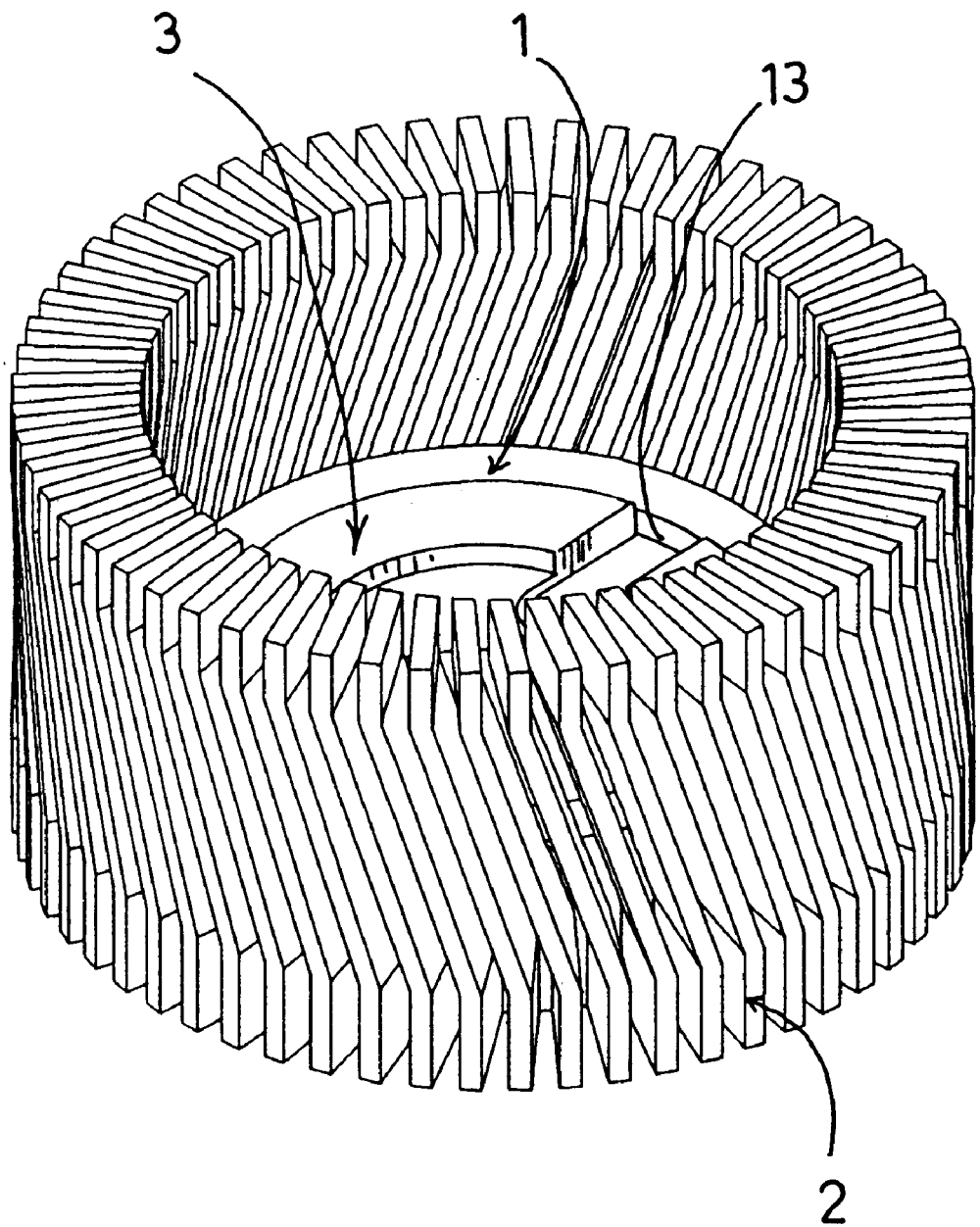
FIG. 7 is a perspective view showing that the fan seat is fitted into the base section of the cylindrical radiator with twisted heat-radiating fins.
Figure 8:
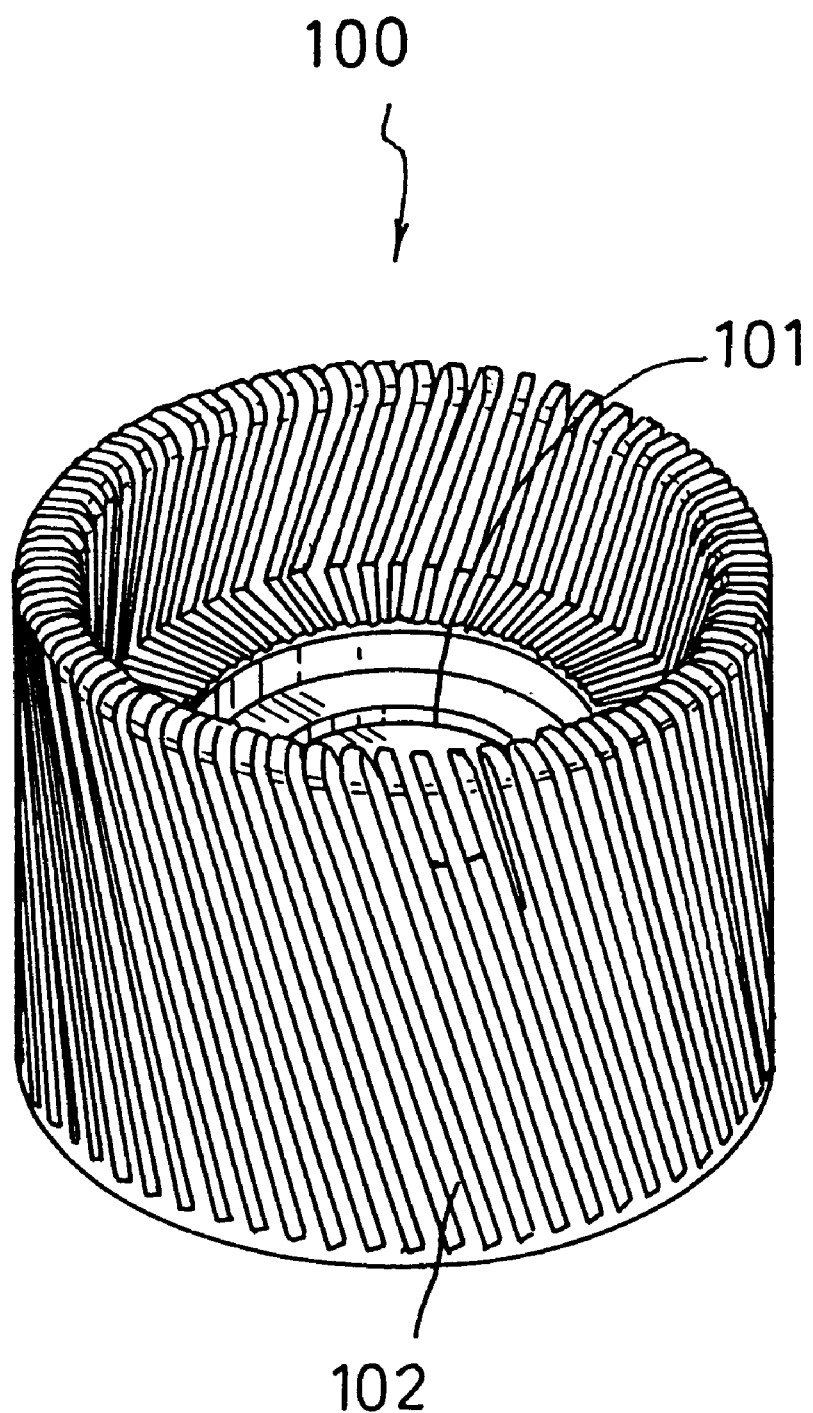
FIG. 8 is a perspective view of a conventional radiator integrally formed of a solid bar material by processing.

FIGS. 1, 2, 5, 6 and 7 show a second embodiment of the present invention, which includes the steps of:

(a) by way of drawing, manufacturing a blank material with a hollow cylindrical base section 1 and multiple heat-radiating fins 2 radially projecting from the outer circumference of the base section 1;

(b) cutting the above elongated blank material into a certain length to form a blank material 10 (as shown in FIG. 1);

(c) from one end face of the blank material 10, axially turning a top portion 11 of the hollow cylindrical base section so as to separate the top portions 21 of the heat-radiating fins from each other to form a free end, only the bottom root portions 22 of the heat-radiating fins integrally connecting with the bottom end 12 of the base section (as shown in FIG. 2); and (d) clamping two ends of each heat-radiating fin 2 with the clamping jaws 41 of two cramps 4 (as shown in FIG. 5) and twisting the two cramps 4 relative to each other so as to bend and incline the heat-radiating fin 2 to form turbo fins (as shown in FIG. 6); and (e) fitting a fan seat 3 into the central through hole 13 of the base section to complete the manufacturing of the cylindrical radiator with turbo fins (as shown in FIG. 7).

In the above embodiment, by means of twisting the two cramps 4 relative to each other, the heat-radiating fins 2 are bent to form turbo fins. Such manufacturing procedure can be quickly performed and the turbo heat-radiating fins 2 are able to expedite the turbulence of the airflow of the fan and thus enhance the heat-radiating efficiency.

In the above two embodiments of the present invention, by way of drawing, the respective heat-radiating fins 2 are formed at one time rather than milled one by one as conventional measure. Therefore, the manufacturing procedure is simplified and the manufacturing time and cost are reduced.

According to the above arrangement, the present invention has the following advantages:

1. It is unnecessary to manufacture the cylindrical radiator with solid material so that the waste of resource is reduced and the cost for the material is lowered.
2. The respective heat-radiating fins are formed at one time by way of drawing rather than milled one by one. Therefore, the heat-radiating fins can be formed very quickly.
3. The manufacturing procedure is speeded so that the manufacturing cost is effectively lowered to enhance competitive ability of the product.

The above embodiments are only used to illustrate the present invention, not intended to limit the scope thereof. Many modifications of the above embodiments can be made without departing from the spirit of the present invention.

What is claimed is:

1. A method for manufacturing a cylindrical radiator, comprising the steps of:

a. drawing material to form an elongated blank material having a hollow cylindrical base section and multiple heat-radiating fins radially projecting from an outer circumference of the base section;

b. cutting said elongated blank material to form a plurality of blanks of predetermined length; and, c. for each of said plurality of blanks:
   i) axially turning an upper portion of said hollow cylindrical base section to separate a top portion of each of said heat-radiating fins from each other and maintaining a bottom root portion of each of said heat-radiating fins integrally connected to said hollow cylindrical base section;
   ii) clamping opposing axial ends of said plurality of heat-radiating fins with a pair of clamps and rotating said clamps in opposing directions relative to one another for bending said heat-radiating fins into a turbo fin configuration;
   iii) forming a fan seat with a disc section having a boss section axially projecting from a central portion of said disc section and dimensioned to snugly fit a central through hole of said base section;
   iv) forming a dent in a top end of said boss section for receiving a fan therein; and,
   v) fitting said boss section of said fan seat into said central through hole of said base section.

2. The method as recited in claim 1, wherein said step of forming a dent includes the step of forming a notch in a perimeter portion of said boss section for a fan's power cable to pass from said fan seat.

* * * * *